US012701673B2

(12) United States Patent
Alissa et al.

(10) Patent No.: US 12,701,673 B2
(45) Date of Patent: Aug. 4, 2026

(54) SYSTEMS AND METHODS FOR MIXING IMMERSION FLUIDS IN IMMERSION-COOLED DATACENTERS

(71) Applicant: Microsoft Technology Licensing, LLC, Redmond, WA (US)

(72) Inventors: Husam Atallah Alissa, Redmond, WA (US); Ioannis Manousakis, Redmond, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 556 days.

(21) Appl. No.: 17/565,272

(22) Filed: Dec. 29, 2021

(65) Prior Publication Data

US 2023/0209773 A1 Jun. 29, 2023

(51) Int. Cl.
*H05K 7/20* (2006.01)

(52) U.S. Cl.
CPC ......... *H05K 7/203* (2013.01); *H05K 7/20318* (2013.01); *H05K 7/20327* (2013.01); *H05K 7/20381* (2013.01)

(58) Field of Classification Search
CPC ................ H05K 7/20236; H05K 7/203; F25B 2400/23; F25B 15/025
See application file for complete search history.

(56) References Cited

U.S. PATENT DOCUMENTS

| | | | | |
|---|---|---|---|---|
| 4,570,043 A | * | 2/1986 | Lloyd | ...................... H01B 3/24 |
| | | | | 252/570 |
| 5,099,908 A | | 3/1992 | Taraci et al. | |
| 5,265,432 A | * | 11/1993 | Luepke | ................. F16N 39/005 |
| | | | | 159/901 |
| 2013/0003296 A1 | * | 1/2013 | Huettner | ............ H05K 7/20827 |
| | | | | 361/679.52 |
| 2013/0105120 A1 | * | 5/2013 | Campbell | .............. H05K 7/203 |
| | | | | 165/104.21 |
| 2013/0139998 A1 | * | 6/2013 | Hayashi | ............. H05K 7/20236 |
| | | | | 165/47 |
| 2014/0218861 A1 | * | 8/2014 | Shelnutt | ............. H05K 7/20818 |
| | | | | 361/679.53 |
| 2019/0357379 A1 | * | 11/2019 | Kolar | ................. H05K 7/20827 |

(Continued)

FOREIGN PATENT DOCUMENTS

| | | | | |
|---|---|---|---|---|
| CN | 113230934 A | * | 8/2021 | .............. B01F 35/80 |
| WO | 2007075599 A2 | | 7/2007 | |

OTHER PUBLICATIONS

CN-113230934-A Translation (Year: 2021).*

(Continued)

*Primary Examiner* — David J Teitelbaum

(74) *Attorney, Agent, or Firm* — Ray Quinney & Nebeker P.C.; Paul N. Taylor

(57) ABSTRACT

An immersion cooling system includes an immersion tank, a first fluid reservoir, a second fluid reservoir, and a mixing device. The first fluid reservoir contains a first working fluid having a first boiling temperature. The second fluid reservoir contains a second working fluid having a second boiling temperature. The mixing device mixes at least a portion of the first working fluid and at least a portion of the second working fluid into a mixed working fluid, and the mixing device directs the mixed working fluid to the immersion tank.

18 Claims, 4 Drawing Sheets

(56)       References Cited

U.S. PATENT DOCUMENTS

| | | | | |
|---|---|---|---|---|
| 2021/0303145 A1* | 9/2021 | VanGilder | .......... | H05K 7/20836 |
| 2022/0400584 A1* | 12/2022 | Enright | ............. | H05K 7/20818 |
| 2022/0418161 A1* | 12/2022 | Gao | .................. | H05K 7/20327 |

OTHER PUBLICATIONS

"International Search Report and Written Opinion Issued in PCT Application No. PCT/US22/044046", Mailed Date: Dec. 23, 2022, 12 Pages.

* cited by examiner

Figures 6, 7:
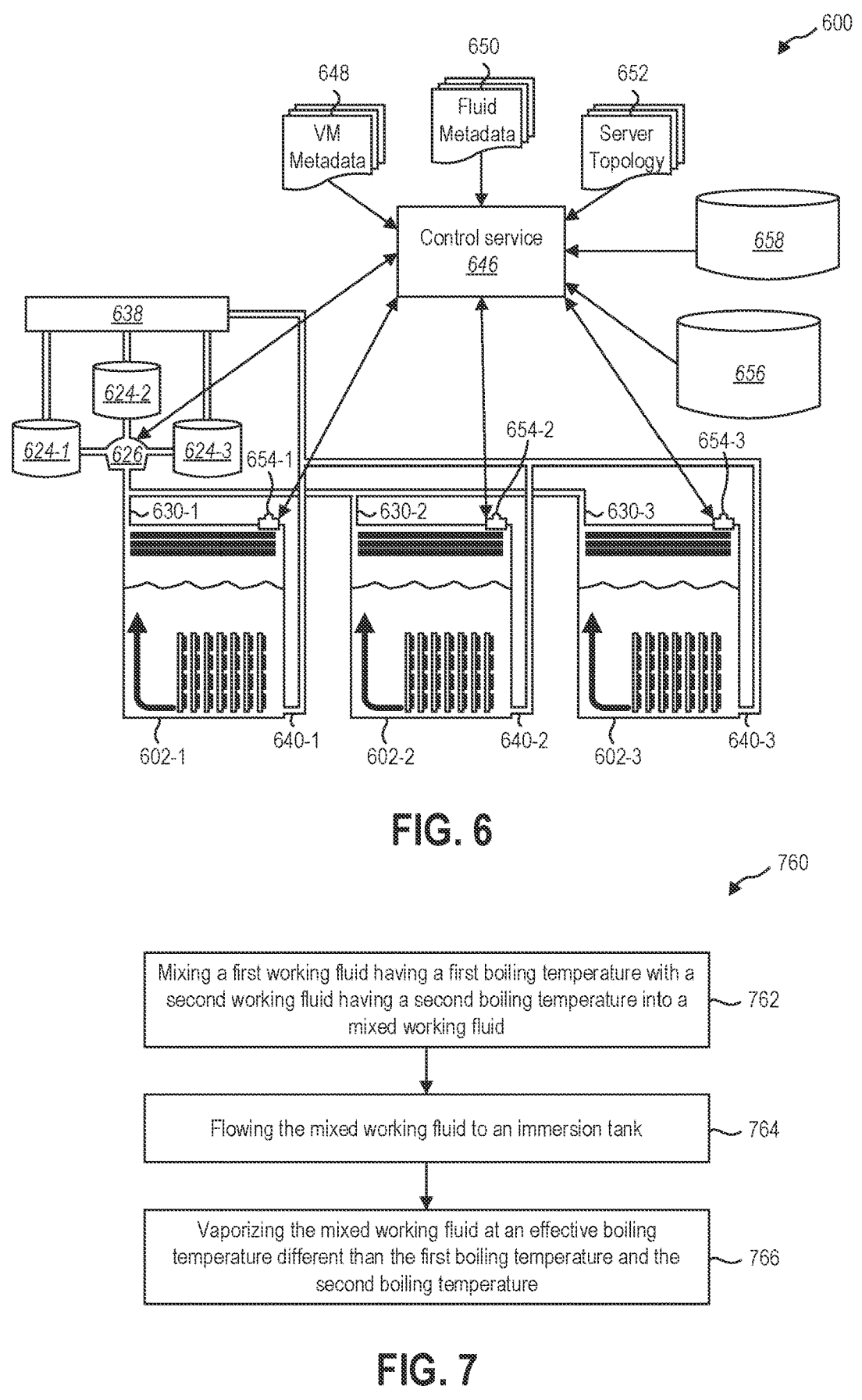

600

648
VM Metadata

650
Fluid Metadata

652
Server Topology

Control service
646

| |
|---|
| Mixing a first working fluid having a first boiling temperature with a second working fluid having a second boiling temperature into a mixed working fluid |

762

| |
|---|
| Flowing the mixed working fluid to an immersion tank |

764

| |
|---|
| Vaporizing the mixed working fluid at an effective boiling temperature different than the first boiling temperature and the second boiling temperature |

SYSTEMS AND METHODS FOR MIXING IMMERSION FLUIDS IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management. Conventional immersion cooling thermal management systems cool the computing device with a single boiling temperature, which may insufficiently cool some computing loads and/or inefficiently cool other computing loads.

BRIEF SUMMARY

In some embodiments, an immersion cooling system includes an immersion tank, a first fluid reservoir, a second fluid reservoir, and a mixing device. The first fluid reservoir contains a first working fluid having a first boiling temperature. The second fluid reservoir contains a second working fluid having a second boiling temperature. The mixing device mixes at least a portion of the first working fluid and at least a portion of the second working fluid into a mixed working fluid, and the mixing device directs the mixed working fluid to the immersion tank.

In some embodiments, an immersion cooling system includes an immersion tank, a first fluid reservoir, a second fluid reservoir, a mixing device, and a control service. The first fluid reservoir contains a first working fluid having a first boiling temperature. The second fluid reservoir contains a second working fluid having a second boiling temperature. The mixing device mixes at least a portion of the first working fluid and at least a portion of the second working fluid into a mixed working fluid, and the mixing device directs the mixed working fluid to the immersion tank. The control service is in data communication with the mixing device, wherein the control service is configured receive at least one operating property of the immersion tank or an electronic component therein and further configured to adjust a mixing ratio of the first working fluid and the second working fluid based at least partially on the operating property.

In some embodiments, a method of thermal management includes mixing a first working fluid having a first boiling temperature with a second working fluid having a second boiling temperature into a mixed working fluid, flowing the mixed working fluid to an immersion tank, and vaporizing the mixed working fluid at an effective boiling temperature different than the first boiling temperature and the second boiling temperature.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 6 is a system diagram of an immersion cooling system with a control service in communication with a mixing device, according to at least one embodiment of the present disclosure; and FIG. 7 is a flowchart illustrating a method of thermal management, according to at least one embodiment of the present disclosure.

DETAILED DESCRIPTION

Figure 1:
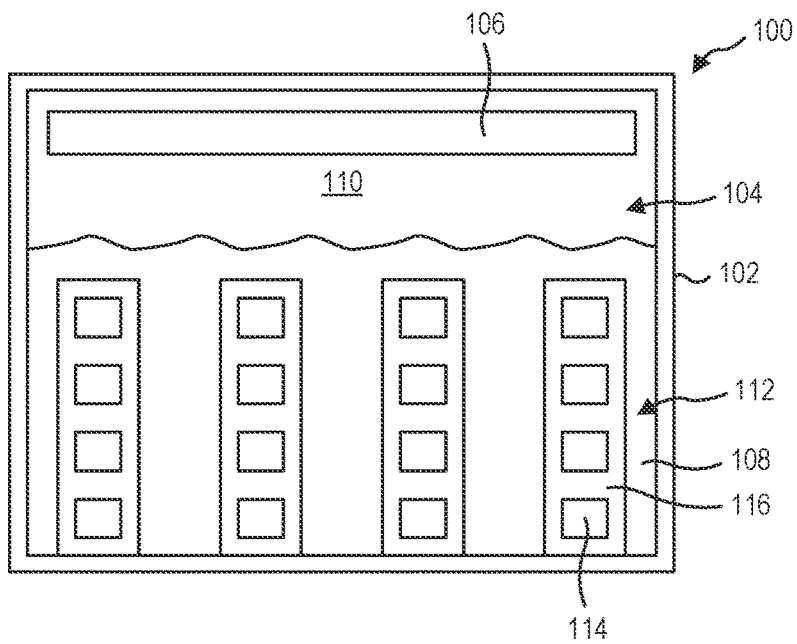
FIG. 1 is a side schematic representation of an immersion cooling system, according to at least one embodiment of the present disclosure.

The present disclosure relates generally to systems and methods for thermal management of electronic devices or other heat-generating components. In some embodiments, immersion cooling systems described herein allow for changes to be made to a working fluid in an immersion tank. The changes to the working fluid can alter the effective boiling temperature of the working fluid in the tank. For example, an immersion cooling system according to the present disclosure includes a plurality of working fluid reservoirs that hold different working fluids. The system includes a mixing device to mix the different working fluids in a mixing ratio to effect one or more desired properties of the working fluid.

In some embodiments, a first working fluid with a low boiling temperature is mixed with a second working fluid with a high boiling temperature to provide a mixed working fluid in the immersion tank that has an effective boiling temperature between the low boiling temperature and the high boiling temperature. In some embodiments, an immersion cooling system includes a separator to separate the mixed working fluid into the first working fluid and the second working fluid before the first working fluid and the second working fluid are returned to the first working fluid reservoir and second working fluid reservoir, respectively.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system. In some embodiments, changing the effective boiling temperature of the immersion working fluid can allow the immersion cooling system to more efficiently remove heat from the system.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
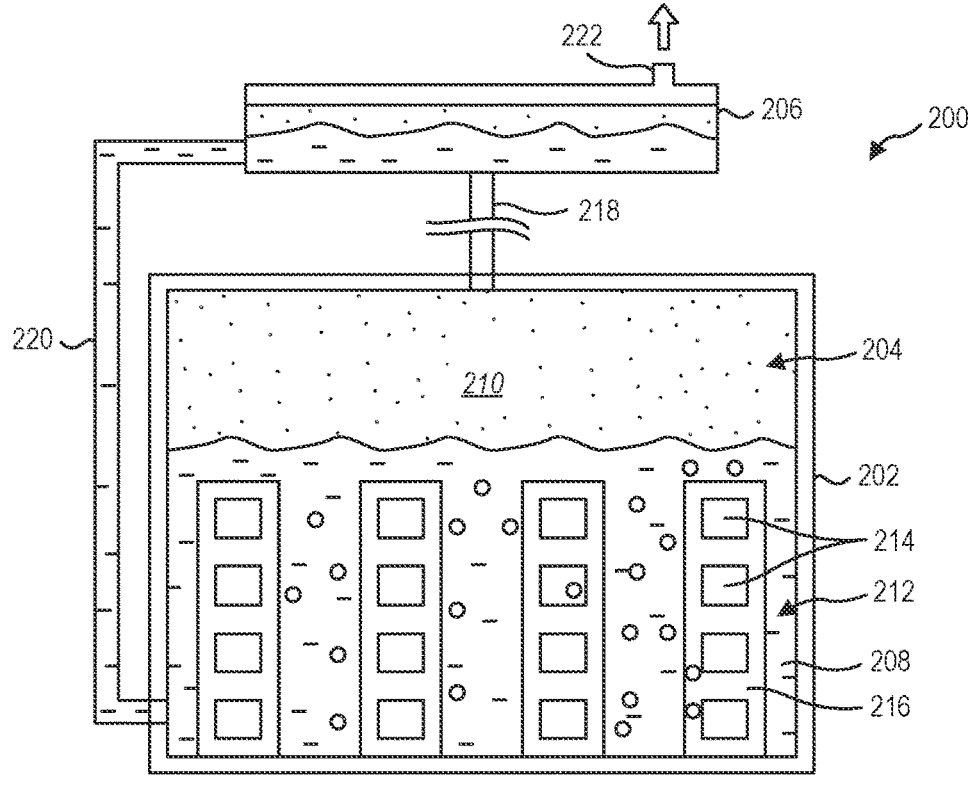
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200. As the operating conditions of the immersion cooling system 200 change, the immersion cooling system 200 can change a mixing ratio of the immersion working fluid to change at least one property (such as boiling temperature) of the immersion working fluid.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage. In some embodiments, a boiling temperature of the immersion working fluid is changed (for example, by altering a mixing ratio) to keep the boiling temperature of the immersion working fluid in the immersion tank below an expected or measured operating temperature of the heat-generating components. For example, when a heat-generating component is measured to be operating at 60° C., the boiling temperature of the immersion working fluid can be adjusted to remain below 60° C. and within a threshold of 60° C., such as within 5° C. or within 10% of 60° C.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar nonconductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Figure 3:
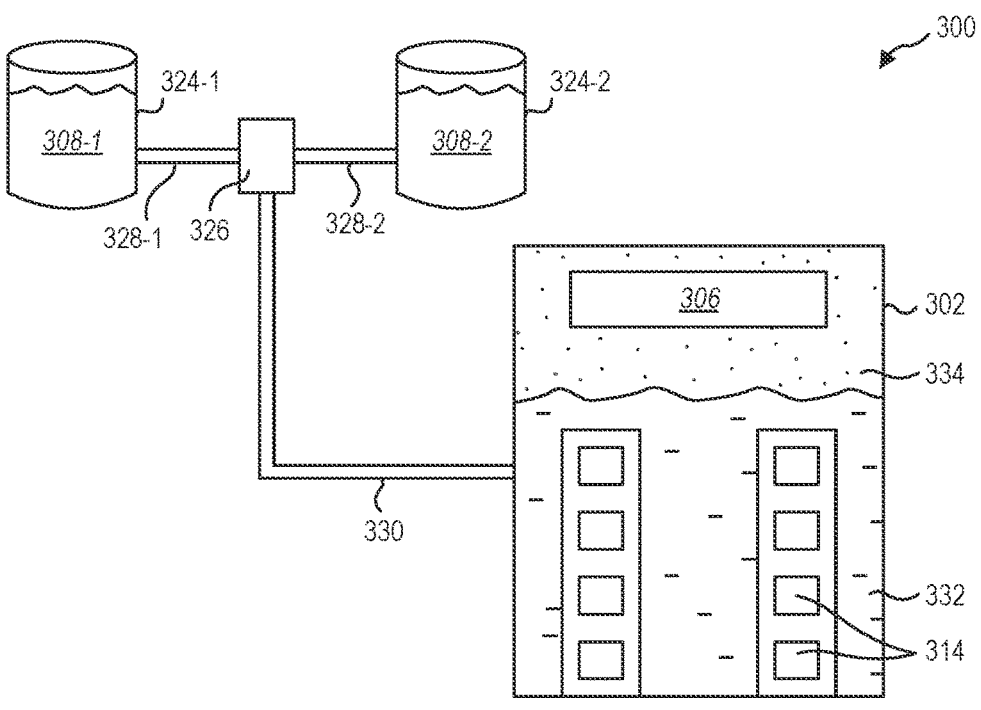
FIG. 3 is a system diagram of an immersion cooling system with a plurality of fluid reservoirs to create a mixed working fluid, according to at least one embodiment of the present disclosure.

FIG. 3 is a system diagram of an embodiment of an immersion cooling system 300 according to the present disclosure. The immersion cooling system 300 includes an immersion tank 302 that receives working fluid from a plurality of working fluid reservoirs 324-1, 324-2. In some embodiments, the first working fluid reservoir 324-1 includes a first liquid working fluid 308-1, and the second working fluid reservoir 324-2 contains a second liquid working fluid 308-2. The first working fluid reservoir 324-1 provides the first liquid working fluid 308-1 to a mixing device 326 through a first supply conduit 328-1. The second working fluid reservoir 324-2 provides the second liquid working fluid 308-2 to a mixing device 326 through a second supply conduit 328-2.

In some embodiments, the mixing device 326 is a regulator that selectively allows a mixing ratio of the first liquid working fluid 308-1 and the second liquid working fluid 308-2 through the regulator into the mixed supply conduit 330. For example, a regulator that permits twice as much first liquid working fluid 308-1 as second liquid working fluid 308-2 through the regulator provides a mixing ratio of 2:1 (first liquid working fluid 308-1 to second liquid working fluid 308-2). The mixed supply conduit 330 carries the mixed working fluid to the immersion tank 302 where the mixed liquid working fluid 332 can receive heat from the heat-generating components 314 and vaporize into the mixed vapor working fluid 334.

In some embodiments, the mixing device 326 includes one or more fluid pumps that pump the first liquid working fluid 308-1 and the second liquid working fluid 308-2 to a junction where the first liquid working fluid 308-1 and the second liquid working fluid 308-2 mix. The flowrate of the fluid pump(s) of the mixing device 326 alter the mixing ratio. For example, a mixing device 326 with a first fluid pump in the first supply conduit 328-1 with a first flowrate of 0.1 gallons per minute (gpm) and a second fluid pump in the second supply conduit 328-2 with a second flowrate of 0.2 gpm will provide a mixing ratio of 1:2 (first liquid working fluid 308-1 to second liquid working fluid 308-2).

In some embodiments, the mixing device 326 includes one or more valves that control a flow of the first liquid working fluid 308-1 and a flow of the second liquid working fluid 308-2, separately. The first liquid working fluid 308-1 and the second liquid working fluid 308-2 flow through the valves to a junction where the first liquid working fluid 308-1 and the second liquid working fluid 308-2 mix. The flowrate of the through the valve(s) of the mixing device 326 alter the mixing ratio. For example, a mixing device 326 with a first valve in the first supply conduit 328-1 with a first flowrate of 0.05 gpm and a second fluid pump in the second supply conduit 328-2 with a second flowrate of 0.5 gpm will provide a mixing ratio of 1:10 (first liquid working fluid 308-1 to second liquid working fluid 308-2).

The mixed working fluid in the immersion tank 302, therefore, includes both the first working fluid and the second working fluid. The mixed liquid working fluid 332 has, in some embodiments, an effective boiling temperature that is approximately the average of the first boiling temperature of the first liquid working fluid 308-1 and the second boiling temperature of the second liquid working fluid 308-2 relative to the mixing ratio. For example, a 1:1 mixing ratio of a first liquid working fluid 308-1 with a 30° C. first boiling temperature and a second liquid working fluid 308-2 with a 90° C. second boiling temperature produces an effective boiling temperature approximately 60° C. It should be understood that, in some embodiments, the effective boiling temperature is lower than the mathematical average due to vaporization of the lower boiling temperature of the first fluid working fluid 308-1. In the present description, the effective boiling temperature is approximated as the mathematical average for simplicity.

In some embodiments, the first liquid working fluid 308-1 and the second liquid working fluid 308-2 are miscible fluids. A miscible first liquid working fluid 308-1 and second liquid working fluid 308-2 form a homogenous mixed liquid working fluid 332 when mixed together. In some embodiments, the first liquid working fluid 308-1 and the second liquid working fluid 308-2 are the same polymer chain to ensure miscibility.

In some embodiments, the mixed liquid working fluid 332 experiences fractionation in the cooling volume (e.g., at or near a surface of the heat-generating component 314 and/or heat spreader in thermal conduction with the heat-generating component 314). Fractionation occurs when the lower boiling temperature working fluid boils more rapidly than the higher boiling temperature working fluid, and the vapor bubbles of the lower boiling temperature working fluid portion rises out of the cooling volume. To limit and/or prevent fractionation, one or more agitators, impellers, stirring devices, etc. are used, in some embodiments, to maintain a homogenous distribution of the first liquid working fluid 308-1 and the second liquid working fluid 308-2 within the mixed liquid working fluid 332.

The immersion cooling system 300, in some embodiments, further includes a condenser 306 in or in fluid communication with the immersion tank 302. The condenser 306 is configured to condense the mixed vapor working fluid 334, which is produced when the mixed liquid working fluid 332 vaporizes, back into the mixed liquid working fluid 332 in the immersion tank 302. In some embodiments, the condenser 306 is a heat exchanger that passively exhausts heat from the mixed vapor working fluid 334 to the ambient atmosphere. For example, in an environment in which the exterior temperature (e.g., outside of the immersion tank 302 and/or outside of a datacenter housing the immersion cooling system 300) is sufficiently cold, the effective boiling temperature of the mixed working fluid may be selected (through selecting a mixing ratio) to condense the mixed vapor working fluid 334 using the ambient exterior temperature.

In at least one example, an ambient temperature is 30° C. during the daytime and 10° C. during nighttime. A mixed working fluid with a boiling temperature of 20° C., therefore, will passively condense in the exterior ambient atmosphere at night, but not during day. As will be described in more detail herein, in some embodiments, the effective boiling temperature of the mixed working fluid is proactively altered based on the exterior temperature varying through a daily cycle. To passively condense the mixed working fluid using the ambient exterior temperature, the effective boiling fluid is selected to be less than the ambient exterior temperature. More specifically, a higher effective boiling temperature may be used during the day, as the condensation temperature is the same as the boiling temperature.

Figure 4:
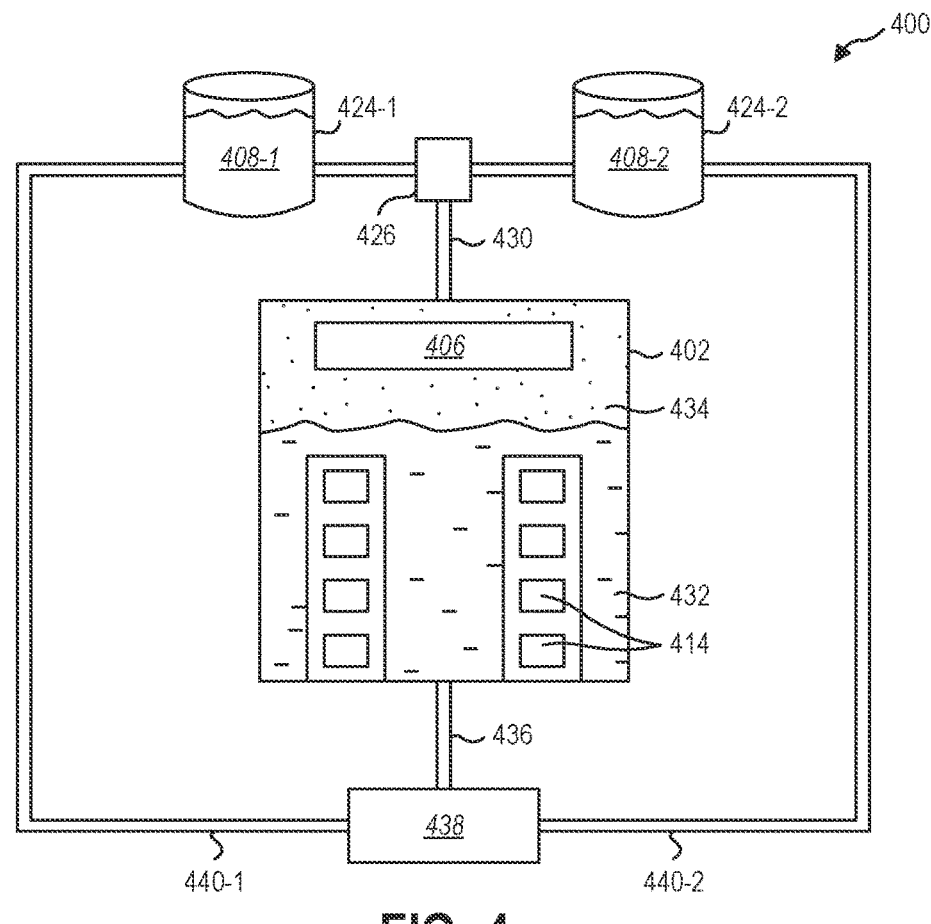
FIG. 4 is a system diagram of an immersion cooling system with a separator to separate a mixed working fluid, according to at least one embodiment of the present disclosure.

FIG. 4 is a system diagram of an immersion cooling system 400 with a separator 438. In some embodiments, an immersion cooling system 400 includes a separator 438 to allow the mixed working fluid to be separated into the constituent components (e.g., the first working fluid and the second working fluid). The separated working fluids are then returned to the respective fluid reservoir 424-1, 424-2 for storage and/or mixing in a new mixing ratio.

In some embodiments, a mixing ratio is selected for the mixed working fluid in the immersion tank 402. The mixed liquid working fluid 432 has an effective boiling temperature based at least partially on the mixing ratio. In some embodiments, the mixed liquid working fluid 432 vaporizes and the mixed vapor working fluid 434 condenses (e.g., via a condenser 406) within the immersion tank 402 to cool the heat-generating components 414. When a change in operating conditions requires, requests, or suggests a change in effective boiling temperature (or other working fluid property), a new mixing ratio of the mixed working fluid may be used.

In some embodiments, a mixing device 426 provides first liquid working fluid 408-1 from the first fluid reservoir 424-1 and second liquid working fluid 408-2 from the second fluid reservoir 424-2 to effect the new mixing ratio in the mixed supply conduit 430 while at least a portion of the old mixed working fluid is removed from the immersion tank by a mixed return conduit 436. The mixed return conduit 436 delivers mixed working fluid from the immersion tank 402 to the separator 438.

In some embodiments, the separator 438 separates the mixed working fluid into the constituent components. In the embodiment illustrated in FIG. 4, the separator 438 separates the mixed working fluid into a first working fluid and the second working fluid, which are returned to the first fluid reservoir 424-1 and the second fluid reservoir 424-2, respectively, via a first working fluid return line 440-1 and a second working fluid return line 440-2, respectively.

The separator 438 includes, in some embodiments, a sequential condenser. For example, mixed working fluid may be removed from the immersion tank 402 by pumping or venting the mixed vapor working fluid 434 from the immersion tank 402. The mixed vapor working fluid 434 flows into a sequential condenser of the separator that cools the mixed vapor working fluid 434 below the boiling (condensing) temperature of the higher boiling temperature constituent working fluid to selectively condense the higher boiling temperature constituent working fluid from the mixed vapor working fluid 434. In the embodiment illustrated in FIG. 4, the second working fluid, having a higher boiling temperature, is condensed first from the mixed vapor working fluid 434, and the remaining first working fluid is condensed at a lower temperature. In other embodiments, more condensers in the sequential condenser are used to separate a mixed working fluid with more constituents. For example, a mixed working fluid that has four working fluids therein may use 4 or more condensers, or condensation temperatures, in sequence.

In some embodiments, the separator 438 further includes a heating element to boil at least a portion of the mixed working fluid received from the mixed return line 436. In some embodiments, mixed liquid working fluid 432 is removed from the immersion tank 402 and provided to the separator 438. The mixed liquid working fluid 432 may be vaporized and then sequentially condensed as described herein to separate the constituent working fluids.

A sequential boiler may be used to separate the constituent parts of the mixed liquid working fluid 432. In some embodiments, a sequential boiler selectively boils a first liquid working fluid 408-1 from the mixed liquid working fluid 432 into a vapor, and the remaining second liquid working fluid 408-2. The vapor can be recondensed and the constituent working fluids returned to the fluid reservoirs, respectively. In some embodiments, the sequential boiler includes a heating element to boil at least a portion of the mixed liquid working fluid 432. The heating element may be a dedicated heating element (such as a resistive heating element) to boil at least a portion of the mixed liquid working fluid 432, or the heating element may be another heat-generating component, such as a networking switch, power supply, or processor, from which the separator receives heat to boil at least a portion of the mixed liquid working fluid 432.

In at least one embodiment, the constituent working fluids are separated by specific gravity. For example, a column of liquid phase, vapor phase, or both of mixed working fluid can be allowed to separate into constituent working fluids of different densities, allowing the mixed working fluid to be separated.

Figure 5:
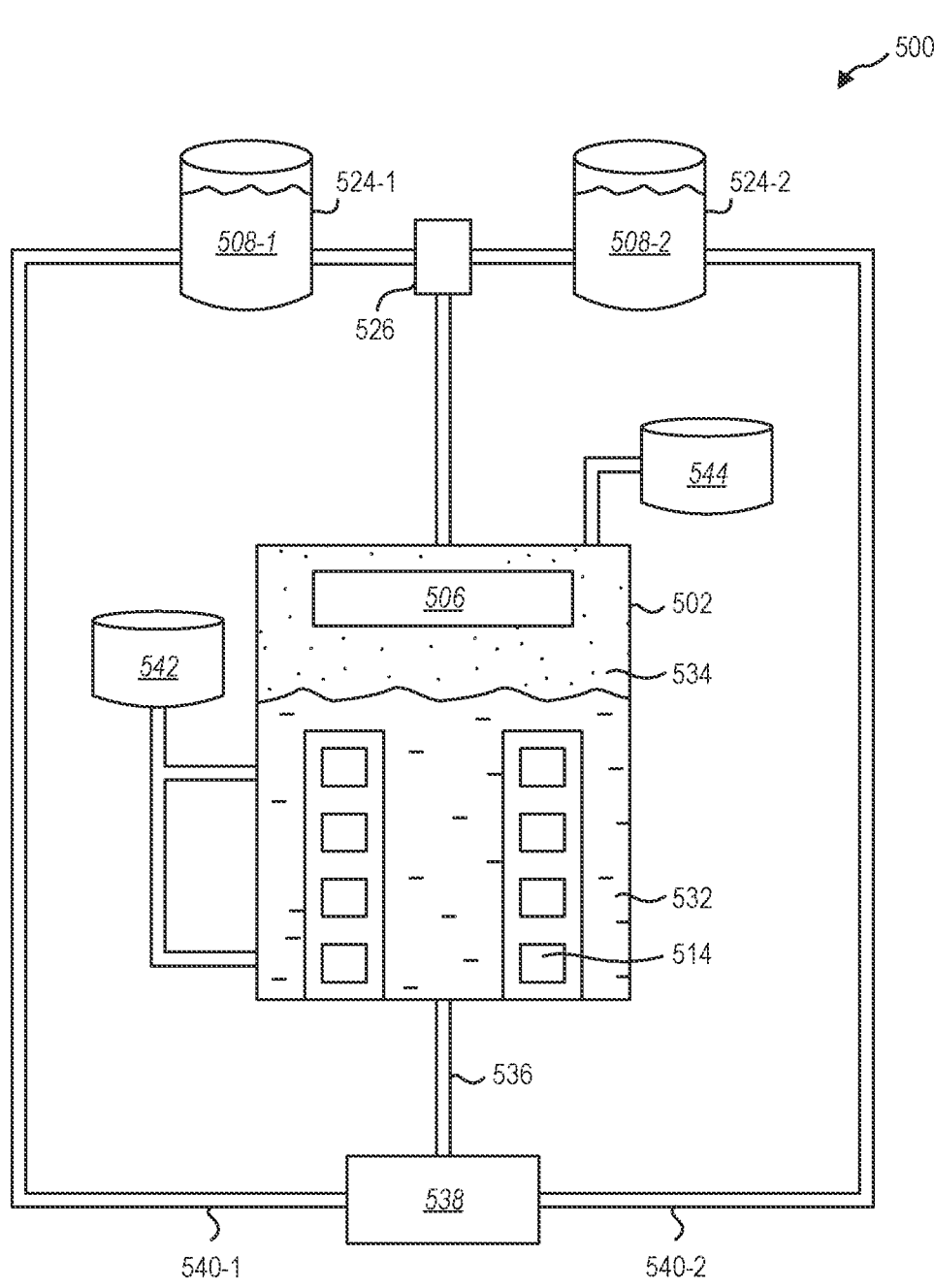
FIG. 5 is a system diagram of an immersion cooling system with a plurality of systems to alter the working fluid of the immersion tank, according to at least one embodiment of the present disclosure.

FIG. 5 illustrates an embodiment of an immersion cooling system 500 with a mixed working fluid that allows additional agents to be added to the working fluid(s) to further adjust a boiling temperature. In some embodiments, an immersion cooling system 500 with a plurality of fluid reservoirs 524-1, 524-2 and a mixing device 526 to create a mixed working fluid from a first liquid working fluid 508-1 and a second liquid working fluid 508-2, and a separator 538 to separate the mixed working fluid, can receive and recover additional agents in the working fluid, such as in solution with the working fluid. The mixed liquid working fluid 532 is boiled by the heat-generating components 514 into a mixed vapor working fluid 534, which is condensed by a condenser 506.

In some embodiments, the immersion cooling system 500 can adjust the boiling temperature of the mixed working fluid to adjust the amount of thermal management provided to the heat-generating components 514. For example, a lower boiling temperature of the mixed working fluid allows more heat to be removed from the components through the latent heat of boiling. In some instances, further adjustments to the mixed working fluid boiling temperature are possible by introducing a solid, liquid, or vapor agent into the mixed working fluid without requiring additional working fluid to be provided from the fluid reservoirs 524-1, 524-2.

In some embodiments, the immersion cooling system 500 includes additional components that allow for additional vapors, liquids, or solids to be introduced into the immersion tank 502 to provide additional control. The boiling temperature, viscosity, heat capacity, and other properties of the mixed working fluid in the immersion tank 502 are adjustable by varying the mixing ratio of the working fluids from the fluid reservoirs 524-1, 524-2. The mixed working fluid can be removed and the separator 538 can allow the used mixed working fluid to be returned to the fluid reservoirs 524-1, 524-2 to be reused in a different mixing ratio to provide different working fluid properties for cooling.

In some embodiments, a supplemental liquid system 542 can provide an additional and/or supplemental liquid agent to the immersion tank 502. In some embodiments, the supplemental liquid agent alters at least one working fluid property of the mixed liquid working fluid 532. In some examples, the supplemental liquid agent is immiscible with the mixed liquid working fluid 532. In other examples, the supplemental liquid agent is miscible with the mixed liquid working fluid 532. In some examples, the supplemental liquid agent alters a boiling temperature of the mixed liquid working fluid 532.

In some embodiments, a supplemental vapor system 544 can provide an additional and/or supplemental vapor agent to the immersion tank 502. In some embodiments, the supplemental vapor agent alters at least one working fluid property of the mixed vapor working fluid 534 and/or introduces one or more impurities into the mixed vapor working fluid 534. In some examples, the supplemental vapor agent alters a condensation temperature of the mixed vapor working fluid 534.

In some embodiments, the solid, liquid, or vapor agent is separated and recovered by the separator 538. For example, a salt introduced to lower the boiling temperature of the mixed liquid working fluid 532 may be recovered during boiling separation of the mixed working fluid.

FIG. 6 illustrates an embodiment of an immersion cooling system 600 that reactively and/or proactively changes a mixing ratio based at least partially on operating conditions of one or more parts of the immersion cooling system 600. In some embodiments, the immersion cooling system 600 includes an immersion tank, such as described herein. In some embodiments, the immersion cooling system 600 includes a plurality of immersion tanks 602-1, 602-2, 602-3. The immersion cooling system 600 includes one or more mixed supply conduits 630-1, 630-1, 630-3 to provide mixed working fluid from a plurality of fluid reservoirs 624-1, 624-2, 624-3 as described herein.

In some embodiments, the immersion cooling system 600 includes a mixing device 626 with a plurality of mixed supply conduits 630-1, 630-1, 630-3 to deliver the mixed liquid working fluid(s) to the plurality of immersion tanks 602-1, 602-2, 602-3. In some embodiments, the immersion cooling system 600 includes a plurality of mixing devices 626, each having a mixed supply conduit 630-1, 630-1, 630-3 connected thereto to deliver the mixed liquid working fluid(s) to the plurality of immersion tanks 602-1, 602-2, 602-3.

The plurality of immersion tanks 602-1, 602-2, 602-3 are further in fluid communication with a separator 638 via a plurality of return conduits 640-1, 640-2, 640-3. In some embodiments, the plurality of immersion tanks 602-1, 602-

2, 602-3 are connected to a plurality of separators 638. The separator 638 returns the constituent working fluids from the mixed working fluid to the plurality of fluid reservoirs 624-1, 624-2, 624-3. In some embodiments, the mixed working fluids from the plurality of immersion tanks 602-1, 602-2, 602-3 have different mixing ratios, but are made of the same constituent working fluids, and, therefore, the return conduits 640-1, 640-2, 640-3 may combine before or at the separator 638. In some embodiments, the separator 638 is configured to separate the constituent working fluids from the mixed working fluid irrespective of the mixing ratio at the separator 638.

In some embodiments, a control service 646 is in data communication with the mixing device(s) 626 to control the mixing ratio of the working fluids from the plurality of fluid reservoirs 624-1, 624-2, 624-3. The control service 646 determines a mixing ratio based at least partially on one or more operating properties of one or more parts of the immersion cooling system 600. The operating properties are obtained by the control service 646 from local and/or remote sensors, computing devices, storage devices, and combinations thereof.

In some embodiments, the control service 646 obtains an operating property such as a virtual machine (VM) metadata, from a VM allocator 648, that includes information regarding computing tasks, operating demands, and VM allocations assigned to the computing devices, electronic components, or other heat-generating components in the plurality of immersion tanks 602-1, 602-2, 602-3. For example, when the VM metadata indicates that the heat-generating components of the first immersion tank 602-1 are performing high-demand computational tasks, such as artificial intelligence, graphics processing, physical simulations, etc., the control service 646 may adjust the mixing ratio of the mixed working fluid in the first immersion tank 602-1. In another example, the VM metadata indicates that the computing devices in the second immersion tank 602-2 are idle, the control service 646 may adjust the mixing ratio of the mixed working fluid in the second immersion tank 602-2.

In some embodiments, the control service 646 has stored thereon or is in communication with a fluid database 650 that includes fluid metadata or other information that provides the control service 646 with operating properties such as fluid properties of the working fluids contained in the plurality of fluid reservoirs 624-1, 624-2, 624-3. For example, the control service 646 may access the fluid database 650 to obtain a boiling temperature of a first working fluid contained in the first fluid reservoir 624-1 and a boiling temperature of a third working fluid contained in the third fluid reservoir 624-3. The control service 646 can then determine a mixing ratio of the first working fluid and the third working fluid to create a mixed working fluid with a desired effective boiling temperature. In some embodiments, the control service 646 communicates with or send instructions to the mixing device 626 to mix the first working fluid and the third working fluid according to the mixing ratio determined at least partially based on the fluid metadata.

The control service 646, in some embodiments, has stored thereon and/or is in communication with a device inventory 652 that includes operating properties such as server topology or topology of other electronic devices in the plurality of immersion tanks 602-1, 602-2, 602-3. In some embodiments, the device inventory 652 includes information related to the components of computing devices in the plurality of immersion tanks 602-1, 602-2, 602-3. For example, the device inventory 652 may include computing device identifications (ID), component information, operating temperature ranges, maximum operating temperatures, power draw properties, power efficiency properties. The device inventory 652 informs the control service 646 what computing devices or electronic components are located where in the plurality of immersion tanks 602-1, 602-2, 602-3 and the properties of the computing devices or electronic components. The control service 646 uses the device inventory to determine the thermal management needed to operate the computing devices or electronic components safely without damage to the computing devices or electronic components in the plurality of immersion tanks 602-1, 602-2, 602-3.

In some embodiments, the control service 646 obtains operating properties of the immersion cooling system 600 from one or more sensors 654-1, 654-2, 654-3. In some embodiments, the sensors 654-1, 654-2, 654-3 provide operating properties of the computing devices and/or electronic components in the plurality of immersion tanks 602-1, 602-2, 602-3, such as power draw of one or more computing devices or components, component temperature, or other real-time conditions of the computing devices and/or electronic components. In some embodiments, the sensors 654-1, 654-2, 654-3 provide operating properties of immersion tank conditions, such as tank temperature (including vapor temperature and/or liquid temperature), liquid level, tank pressure, or other conditions of an interior volume of the immersion tanks.

At least one sensor is, in some embodiments, an external sensor that provides environmental information external to the plurality of immersion tanks 602-1, 602-2, 602-3. For example, the external sensor may provide operating properties of the immersion cooling system 600 that include ambient temperature, ambient air pressure, ambient humidity, time of day, date, or other environmental conditions of the datacenter housing the immersion cooling system 600 or outside the datacenter. In some embodiments, the control service 646 receives one or more operating properties from the external sensor, which the control service 646 uses, at least partially, to determine a mixing ratio of the mixed working fluid. For example, when an ambient temperature decreases, the control service 646 may alter the mixing ratio to decrease an effective boiling temperature of the mixed working fluid to allow condensation using a heat exchanger in the ambient atmosphere. In other examples, when an ambient humidity increases, the control service 646 may alter the mixing ratio to decrease an effective boiling temperature of the mixed working fluid to allow condensation using a heat exchanger in the ambient atmosphere as humid air can absorb heat faster than dry air.

In some embodiments, the control service 646 has stored thereon and/or is in data communication with an environment information database 656, such as with a utilization and environmental predictor. The environment information database 656 can provide operating properties of the immersion cooling system 600 to the control service 646 such as utilization history, environmental history, cooling system performance history, etc. to predict changes in thermal management capacity needs and proactively adjust the mixing ratio to prepare or compensate for the demands of the immersion cooling system 600.

In some embodiments, the control service 646 is further in communication with an energy source operating property 658. For example, depending on the energy source for the immersion cooling system 600, different fluid properties, such as boiling temperature, may allow for improved energy costs relative to the thermal management capacity of the immersion cooling system 600.

The control service 646 obtains, accesses, or receives operating properties of the immersion cooling system 600, and the computing device and/or electronic components therein, to determine a mixing ratio of a plurality of working fluids. The control service 646 can improve the thermal management capacity of the immersion cooling system 600, improve the operating costs of the immersion cooling system 600, improve the environmental impact of the immersion cooling system 600, or combinations thereof.

FIG. 7 is a flowchart illustrating an embodiment of a method 760 of thermal management. In some embodiments, the method 760 includes mixing a first working fluid having a first boiling temperature with a second working fluid having a second boiling temperature into a mixed working fluid at 762. In some embodiments, the method 760 optionally includes mixing more than two working fluids into the mixed working fluid, wherein the working fluids have different boiling temperatures.

In some embodiments, mixing the working fluids is performed with a regulator. In some embodiments, mixing the working fluids is performed with one or more fluid pumps. In some embodiments, mixing the working fluids is performed with one or more valves. In some embodiments, mixing the working fluids is performed at a junction between a first supply conduit and a second supply conduit. In some embodiments, mixing the working fluids is performed in a mixed supply conduit. In some embodiments, the first working fluid and the second working fluid are miscible and mix into a homogeneous fluid.

The method 760 further includes flowing the mixed working fluid to an immersion tank at 764. In some embodiments, the mixed working fluid flows to the immersion tank via a mixed supply conduit. In some embodiments, mixing the working fluid is performed in the immersion tank. For example, the first working fluid and second working fluid may be pumped into an immersion tank and the first working fluid and second working fluid mix in the immersion tank. The immersion tank, in some embodiments, has heat-generating components therein.

The method 760 further includes vaporizing the mixed working fluid at an effective boiling temperature that is different from the first boiling temperature and the second boiling temperature at 766. In some examples, the effective boiling temperature is approximately an average of the first boiling temperature and the second boiling temperature, based at least partially on a mixing ratio of the first working fluid and the second working fluid.

The method 760, optionally, includes separating the mixed working fluid into at least a first working fluid and a second working fluid and returning the first working fluid to a first fluid reservoir and the second working fluid to a second fluid reservoir. In some embodiments, the mixed working fluid is separated by sequential condensation. In some embodiments, the mixed working fluid is separated by sequential boiling. In some embodiments, the first working fluid and second working fluid are mixed again in a different mixing ratio to create a second mixed working fluid with a different boiling temperature.

INDUSTRIAL APPLICABILITY

The present disclosure relates generally to systems and methods for thermal management of electronic devices or other heat-generating components. In some embodiments, immersion cooling systems described herein allow for changes to be made to a working fluid in an immersion tank. The changes to the working fluid can alter the effective boiling temperature of the working fluid in the tank. For example, an immersion cooling system according to the present disclosure includes a plurality of working fluid reservoirs that hold different working fluids. The system includes a mixing device to mix the different working fluids in a mixing ratio to effect one or more desired properties of the working fluid.

In some embodiments, a first working fluid with a low boiling temperature is mixed with a second working fluid with a high boiling temperature to provide a mixed working fluid in the immersion tank that has an effective boiling temperature between the low boiling temperature and the high boiling temperature. In some embodiments, an immersion cooling system includes a separator to separate the mixed working fluid into the first working fluid and the second working fluid before the first working fluid and the second working fluid are returned to the first working fluid reservoir and second working fluid reservoir, respectively.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system. In some embodiments, changing the effective boiling temperature of the immersion working fluid can allow the immersion cooling system to more efficiently remove heat from the system.

In some embodiments, the immersion cooling system includes an immersion tank that receives working fluid from a plurality of working fluid reservoirs. In some embodiments, the first working fluid reservoir includes a first liquid working fluid, and the second working fluid reservoir contains a second liquid working fluid. The first working fluid reservoir provides the first liquid working fluid to a mixing device through a first supply conduit. The second working fluid reservoir provides the second liquid working fluid to a mixing device through a second supply conduit.

In some embodiments, the mixing device is a regulator that selectively allows a mixing ratio of the first liquid working fluid and the second liquid working fluid through the regulator into the mixed supply conduit. For example, regulator that permits twice as much first liquid working fluid as second liquid working fluid through the regulator provides a mixing ratio of 2:1 (first liquid working fluid to second liquid working fluid). The mixed supply conduit carries the mixed working fluid to the immersion tank where the mixed liquid working fluid can receive heat from the heat-generating components and vaporize into the mixed vapor working fluid.

In some embodiments, the mixing device includes one or more fluid pumps that pump the first liquid working fluid and the second liquid working fluid to a junction where the first liquid working fluid and the second liquid working fluid mix. The flowrate of the fluid pump(s) of the mixing device alters the mixing ratio. For example, a mixing device with a first fluid pump in the first supply conduit with a first flowrate of 0.1 gallons per minute (gpm) and a second fluid pump in the second supply conduit with a second flowrate of 0.2 gpm will provide a mixing ratio of 1:2 (first liquid working fluid to second liquid working fluid).

In some embodiments, the mixing device includes one or more valves that control a flow of the first liquid working fluid and a flow of the second liquid working fluid, separately. The first liquid working fluid and the second liquid working fluid flow through the valves to a junction where the first liquid working fluid and the second liquid working fluid mix. The flowrate of the through the valve(s) of the mixing device alter the mixing ratio. For example, a mixing device with a first valve in the first supply conduit with a first flowrate of 0.05 gpm and a second fluid pump in the second supply conduit with a second flowrate of 0.5 gpm will provide a mixing ratio of 1:10.

The mixed working fluid in the immersion tank, therefore, includes both the first working fluid and the second working fluid. The mixed liquid working fluid has, in some embodiments, an effective boiling temperature that is approximately the average of the first boiling temperature of the first liquid working fluid and the second boiling temperature of the second liquid working fluid relative to the mixing ratio. For example, a 1:1 mixing ratio of a first liquid working fluid with a 30° C. first boiling temperature and a second liquid working fluid with a 90° C. second boiling temperature produces an effective boiling temperature approximately 60° C. It should be understood that, in some embodiments, the effective boiling temperature is lower than the mathematical average due to vaporization of the lower boiling temperature of the first fluid working fluid. In the present description, the effective boiling temperature may be approximated as the mathematical average for simplicity.

In some embodiments, the first liquid working fluid and the second liquid working fluid are miscible fluids. A miscible first liquid working fluid and second liquid working fluid form a homogenous mixed liquid working fluid when mixed together. In some embodiments, the first liquid working fluid and the second liquid working fluid are the same polymer chain to ensure miscibility.

In some embodiments, the mixed liquid working fluid experiences fractionation in the cooling volume (e.g., at or near a surface of the heat-generating component and/or heat spreader in thermal conduction with the heat-generating component. Fractionation occurs when the lower boiling temperature working fluid boils more rapidly than the higher boiling temperature working fluid, and the vapor bubbles of the lower boiling temperature working fluid portion rises out of the cooling volume. To limit and/or prevent fractionation, one or more agitators, impellers, stirring devices, etc. are used, in some embodiments, to maintain a homogenous distribution of the first liquid working fluid and the second liquid working fluid within the mixed liquid working fluid.

The immersion cooling system, in some embodiments, further includes a condenser in or in fluid communication with the immersion tank. The condenser is configured to condense the mixed vapor working fluid, which is produced when the mixed liquid working fluid vaporizes, back into the mixed liquid working fluid in the immersion tank. In some embodiments, the condenser is a heat exchanger that passively exhausts heat from the mixed vapor working fluid to the ambient atmosphere. For example, in an environment in which the exterior temperature (e.g., outside of the immersion tank and/or outside of a datacenter housing the immersion cooling system) is sufficiently cold, the effective boiling temperature of the mixed working fluid may be selected (through selecting a mixing ratio) to condense the mixed vapor working fluid using the ambient exterior temperature.

In at least one example, an ambient temperature is 30° C. during the daytime and 10° C. during nighttime. A mixed working fluid with a boiling temperature of 20° C., therefore, will passively condense in the exterior ambient atmosphere at night, but not during day. As will be described in more detail herein, in some embodiments, the effective boiling temperature of the mixed working fluid is proactively altered based on the exterior temperature varying through a daily cycle. To passively condense the mixed working fluid using the ambient exterior temperature, the effective boiling fluid is selected to be less than the ambient exterior temperature. More specifically, a higher effective boiling temperature may be used during the day, as the condensation temperature is the same as the boiling temperature.

In some embodiments, an immersion cooling system includes a separator to allow the mixed working fluid to be separated into the constituent components (e.g., the first working fluid and the second working fluid). The separated working fluids are then returned to the respective fluid reservoir for storage and/or mixing in a new mixing ratio.

In some embodiments, a mixing ratio is selected for the mixed working fluid in the immersion tank. The mixed liquid working fluid has an effective boiling temperature based at least partially on the mixing ratio. In some embodiments, the mixed liquid working fluid vaporizes and the mixed vapor working fluid condenses (e.g., via a condenser) within the immersion tank to cool the heat-generating components. When a change in operating conditions requires, requests, or suggests a change in effective boiling temperature (or other working fluid property), a new mixing ratio of the mixed working fluid may be used.

In some embodiments, a mixing device provides first liquid working fluid from the first fluid reservoir and second liquid working fluid from the second fluid reservoir to effect the new mixing ratio in the mixed supply conduit while at least a portion of the old mixed working fluid is removed from the immersion tank by a mixed return conduit. The mixed return conduit delivers mixed working fluid from the immersion tank to the separator.

In some embodiments, the separator separates the mixed working fluid into the constituent components. In some embodiments, the separator separates the mixed working fluid into a first working fluid and the second working fluid, which are returned to the first fluid reservoir and the second fluid reservoir, respectively, via a first working fluid return line and a second working fluid return line, respectively.

The separator includes, in some embodiments, a sequential condenser. For example, mixed working fluid may be removed from the immersion tank by pumping or venting the mixed vapor working fluid from the immersion tank. The mixed vapor working fluid flows into a sequential condenser of the separator that cools the mixed vapor working fluid below the boiling (and condensing) temperature of the higher boiling temperature constituent working fluid to selectively condense the higher boiling temperature constituent working fluid from the mixed vapor working fluid. In some embodiments, the second working fluid, having a higher boiling temperature, is condensed first from the mixed vapor working fluid, and the remaining first working fluid is condensed at a lower temperature. In other embodiments, more condensers in the sequential condenser are used to separate a mixed working fluid with more constituents. For example, a mixed working fluid that has four working fluids therein may use 4 or more condensers, or condensation temperatures, in sequence.

In some embodiments, the separator further includes a heating element to boil at least a portion of the mixed working fluid received from the mixed return line. In some embodiments, mixed liquid working fluid is removed from the immersion tank and provided to the separator. The mixed liquid working fluid may be vaporized and then sequentially condensed as described herein to separate the constituent working fluids.

A sequential boiler may be used to separate the constituent parts of the mixed liquid working fluid. In some embodiments, a sequential boiler selectively boils a first liquid working fluid from the mixed liquid working fluid into a vapor, and the remaining second liquid working fluid. The vapor can be recondensed and the constituent working fluids returned to the fluid reservoirs, respectively. In some embodiments, the sequential boiler includes a heating element to boil at least a portion of the mixed liquid working fluid. The heating element may be a dedicated heating element (such as a resistive heating element) to boil at least a portion of the mixed liquid working fluid, or the heating element may be another heat-generating component, such as a networking switch, power supply, or processor, from which the separator receives heat to boil at least a portion of the mixed liquid working fluid.

In at least one embodiment, the constituent working fluids are separated by specific gravity. For example, a column of liquid phase, vapor phase, or both of mixed working fluid can be allowed to separate into constituent working fluids of different densities, allowing the mixed working fluid to be separated.

In some embodiments, an immersion cooling system with a mixed working fluid allows additional agents to be added to the working fluid(s) to further adjust a boiling temperature. In some embodiments, an immersion cooling system with a plurality of fluid reservoirs and a mixing device to create a mixed working fluid from a first liquid working fluid and a second liquid working fluid, and a separator to separate the mixed working fluid, can receive and recover additional agents in the working fluid, such as in solution with the working fluid. The mixed liquid working fluid is boiled by the heat-generating components into a mixed vapor working fluid, which is condensed by a condenser.

In some embodiments, the immersion cooling system can adjust the boiling temperature of the mixed working fluid to adjust the amount of thermal management provided to the heat-generating components. For example, a lower boiling temperature of the mixed working fluid allows more heat to be removed from the components through the latent heat of boiling. In some instances, further adjustments to the mixed working fluid boiling temperature are possible by introducing a solid, liquid, or vapor agent into the mixed working fluid without requiring additional working fluid to be provided from the fluid reservoirs.

In some embodiments, the immersion cooling system includes additional components that allow for additional vapors, liquids, or solids to be introduced into the immersion tank to provide additional control. The boiling temperature, viscosity, heat capacity, and other properties of the mixed working fluid in the immersion tank are adjustable by varying the mixing ratio of the working fluids from the fluid reservoirs. The mixed working fluid can be removed, and the separator can allow the used mixed working fluid to be returned to the fluid reservoirs to be reused in a different mixing ratio to provide different working fluid properties for cooling.

In some embodiments, a supplemental liquid system can provide an additional and/or supplemental liquid agent to the immersion tank. In some embodiments, the supplemental liquid agent alters at least one working fluid property of the mixed liquid working fluid. In some examples, the supplemental liquid agent is immiscible with the mixed liquid working fluid. In other examples, the supplemental liquid agent is miscible with the mixed liquid working fluid. In some examples, the supplemental liquid agent alters a boiling temperature of the mixed liquid working fluid.

In some embodiments, a supplemental vapor system can provide an additional and/or supplemental vapor agent to the immersion tank. In some embodiments, the supplemental vapor agent alters at least one working fluid property of the mixed vapor working fluid and/or introduces one or more impurities into the mixed vapor working fluid. In some examples, the supplemental vapor agent alters a condensation temperature of the mixed vapor working fluid.

In some embodiments, the solid, liquid, or vapor agent is separated and recovered by the separator. For example, a salt introduced to lower the boiling temperature of the mixed liquid working fluid may be recovered during boiling separation of the mixed working fluid.

In some embodiments, the immersion cooling system includes an immersion tank, such as described herein. In some embodiments, the immersion cooling system includes a plurality of immersion tanks. The immersion cooling system includes one or more mixed supply conduits to provide mixed working fluid from a plurality of fluid reservoirs as described herein.

In some embodiments, the immersion cooling system includes a mixing device with a plurality of mixed supply conduits to deliver the mixed liquid working fluid(s) to the plurality of immersion tanks. In some embodiments, the immersion cooling system includes a plurality of mixing devices, each having a mixed supply conduit connected thereto to deliver the mixed liquid working fluid(s) to the plurality of immersion tanks.

The plurality of immersion tanks is further in fluid communication with a separator via a plurality of return conduits. In some embodiments, the plurality of immersion tanks is connected to a plurality of separators. The separator returns the constituent working fluids from the mixed working fluid to the plurality of fluid reservoirs. In some embodiments, the mixed working fluids from the plurality of immersion tanks have different mixing ratios, but are made of the same constituent working fluids, and, therefore, the return conduits may combine before or at the separator. In some embodiments, the separator is configured to separate the constituent working fluids from the mixed working fluid irrespective of the mixing ratio at the separator.

In some embodiments, a control service is in data communication with the mixing device(s) to control the mixing ratio of the working fluids from the plurality of fluid reservoirs. The control service determines a mixing ratio based at least partially on one or more operating properties of one or more parts of the immersion cooling system. The operating properties are obtained by the control service from local and/or remote sensors, computing devices, storage devices, and combinations thereof.

In some embodiments, the control service obtains an operating property such as a virtual machine (VM) metadata, from a VM allocator, that includes information regarding computing tasks, operating demands, and VM allocations assigned to the computing devices, electronic components, or other heat-generating components in the plurality of immersion tanks. For example, when the VM metadata indicates that the heat-generating components of the first immersion tank are performing high-demand computational tasks, such as artificial intelligence, graphics processing, physical simulations, etc., the control service may adjust the mixing ratio of the mixed working fluid in the first immersion tank. In another example, the VM metadata indicates that the computing devices in the second immersion tank are idle, the control service may adjust the mixing ratio of the mixed working fluid in the second immersion tank.

In some embodiments, the control service has stored thereon or is in communication with a fluid database that includes fluid metadata or other information that provides the control service with operating properties such as fluid properties of the working fluids contained in the plurality of fluid reservoirs. For example, the control service may access the fluid database to obtain a boiling temperature of a first working fluid contained in the first fluid reservoir and a boiling temperature of a third working fluid contained in the third fluid reservoir. The control service can then determine a mixing ratio of the first working fluid and the third working fluid to create a mixed working fluid with a desired effective boiling temperature. In some embodiments, the control service communicates with or send instructions to the mixing device to mix the first working fluid and the third working fluid according to the mixing ratio determined at least partially based on the fluid metadata.

The control service, in some embodiments, has stored thereon and/or is in communication with a device inventory that includes operating properties such as server topology or topology of other electronic devices in the plurality of immersion tanks. In some embodiments, the device inventory includes information related to the components of computing devices in the plurality of immersion tanks. For example, the device inventory may include computing device identifications (ID), component information, operating temperature ranges, maximum operating temperatures, power draw properties, power efficiency properties. The device inventory informs the control service what computing devices or electronic components are located where in the plurality of immersion tanks and the properties of the computing devices or electronic components. The control service uses the device inventory to determine the thermal management needed to operate the computing devices or electronic components safely without damage to the computing devices or electronic components in the plurality of immersion tanks.

In some embodiments, the control service obtains operating properties of the immersion cooling system from one or more sensors. In some embodiments, the sensors provide operating properties of the computing devices and/or electronic components in the plurality of immersion tanks, such as power draw of one or more computing devices or components, component temperature, or other real-time conditions of the computing devices and/or electronic components. In some embodiments, the sensors provide operating properties of immersion tank conditions, such as tank temperature (including vapor temperature and/or liquid temperature), liquid level, tank pressure, or other conditions of an interior volume of the immersion tanks.

At least one sensor is, in some embodiments, an external sensor that provides environmental information external to the plurality of immersion tanks. For example, the external sensor may provide operating properties of the immersion cooling system that include ambient temperature, ambient air pressure, ambient humidity, time of day, date, or other environmental conditions of the datacenter housing the immersion cooling system or outside the datacenter. In some embodiments, the control service receives one or more operating properties from the external sensor, which the control service uses, at least partially, to determine a mixing ratio of the mixed working fluid. For example, when an ambient temperature decreases, the control service may alter the mixing ratio to decrease an effective boiling temperature of the mixed working fluid to allow condensation using a heat exchanger in the ambient atmosphere. In other examples, when an ambient humidity increases, the control service may alter the mixing ratio to decrease an effective boiling temperature of the mixed working fluid to allow condensation using a heat exchanger in the ambient atmosphere as humid air can absorb heat faster than dry air.

In some embodiments, the control service has stored thereon and/or is in data communication with an environment information database, such as with a utilization and environmental predictor. The environment information database can provide operating properties of the immersion cooling system to the control service such as utilization history, environmental history, cooling system performance history, etc. to predict changes in thermal management capacity needs and proactively adjust the mixing ratio to prepare or compensate for the demands of the immersion cooling system.

In some embodiments, the control service is further in communication with an energy source operating property. For example, depending on the energy source for the immersion cooling system, different fluid properties, such as boiling temperature, may allow for improved energy costs relative to the thermal management capacity of the immersion cooling system.

The control service obtains, accesses, or receives operating properties of the immersion cooling system, and the computing device and/or electronic components therein, to determine a mixing ratio of a plurality of working fluids. The control service can improve the thermal management capacity of the immersion cooling system, improve the operating costs of the immersion cooling system, improve the environmental impact of the immersion cooling system, or combinations thereof.

In some embodiments, a method of thermal management includes mixing a first working fluid having a first boiling temperature with a second working fluid having a second boiling temperature into a mixed working fluid. In some embodiments, the method optionally includes mixing more than two working fluids into the mixed working fluid, wherein the working fluids have different boiling temperatures.

In some embodiments, mixing the working fluids is performed with a regulator. In some embodiments, mixing the working fluids is performed with one or more fluid pumps. In some embodiments, mixing the working fluids is performed with one or more valves. In some embodiments, mixing the working fluids is performed at a junction between a first supply conduit and a second supply conduit. In some embodiments, mixing the working fluids is performed in a mixed supply conduit. In some embodiments, the first working fluid and the second working fluid are miscible and mix into a homogeneous fluid.

The method further includes flowing the mixed working fluid to an immersion tank. In some embodiments, the mixed working fluid flows to the immersion tank via a mixed supply conduit. In some embodiments, mixing the working fluid is performed in the immersion tank. For example, the first working fluid and second working fluid may be pumped into an immersion tank and the first working fluid and second working fluid mix in the immersion tank. The immersion tank, in some embodiments, has heat-generating components therein.

The method further includes vaporizing the mixed working fluid at an effective boiling temperature that is different from the first boiling temperature and the second boiling temperature. In some examples, the effective boiling temperature is approximately an average of the first boiling temperature and the second boiling temperature, based at least partially on a mixing ratio of the first working fluid and the second working fluid.

The method, optionally, includes separating the mixed working fluid into at least a first working fluid and a second working fluid and returning the first working fluid to a first fluid reservoir and the second working fluid to a second fluid reservoir. In some embodiments, the mixed working fluid is separated by sequential condensation. In some embodiments, the mixed working fluid is separated by sequential boiling. In some embodiments, the first working fluid and second working fluid are mixed again in a different mixing ratio to create a second mixed working fluid with a different boiling temperature.

The present disclosure relates to systems and methods for cooling heat-generating components of a computer or computing device according to at least the examples provided in the sections below:

[A1] In some embodiments, an immersion cooling system includes an immersion tank, a first fluid reservoir, a second fluid reservoir, and a mixing device. The first fluid reservoir contains a first working fluid having a first boiling temperature. The second fluid reservoir contains a second working fluid having a second boiling temperature. The mixing device mixes at least a portion of the first working fluid and at least a portion of the second working fluid into a mixed working fluid, and the mixing device directs the mixed working fluid to the immersion tank.

[A2] In some embodiments, the first boiling temperature of [A1] is between 30° C. and 60° C. to allow the mixed working fluid to have a mixed boiling temperature closer to an ambient temperature.

[A3] In some embodiments, the first boiling temperature of [A1] is between 60° C. and 90° C. to allow the mixed working fluid to have a mixed boiling temperature similar to an operating temperature of computing components under heavy computational loads and/or power draw.

[A4] In some embodiments, the first boiling temperature of [A1] is at least 20° C. less than the second boiling temperature to allow the mixed working fluid to have at least a 20° C. range of possible boiling temperatures.

[A5] In some embodiments, the mixing device of any of [A1] through [A4] is a regulator to allow a proportional mixing ratio of the first working fluid and second working fluid at the mixing device.

[A6] In some embodiments, the mixing device of any of [A1] through [A4] is a junction between a first supply conduit configured to supply the first working fluid toward the immersion tank and a second supply conduit configured to supply the second working fluid toward the immersion tank. The junction connects the first supply conduit and the second supply conduit to a mixed supply conduit that provides fluid communication to the immersion tank. In some embodiments, the system includes fluid pumps for the working fluid tanks, and the junction allows mixing of the first working fluid and second working fluid with less parts and less potential failure points.

[A7] In some embodiments, the immersion cooling system of any of [A1] through [A6] includes a separator in fluid communication with the immersion tank and configured to separate mixed working fluid into the first working fluid from the second working fluid. In some embodiments, the separator allows the first working fluid and second working fluid to be recycled through system, saving costs and lessening environmental impact.

[A8] In some embodiments, the separator of [A7] includes a condenser configured to condense a vapor phase of the mixed working fluid to save energy in separation, as the mixed working fluid is already boiled during the thermal management process in the immersion tank.

[A9] In some embodiments, the separator of [A7] includes a heating element to selectively boil one of the first working fluid and the second working fluid from the mixed working fluid. In some embodiments, extraction of the mixed liquid working fluid is more practical and/or efficient than the mixed vapor working fluid, allowing faster changes in mixing ratio of the mixed working fluid.

[A10] In some embodiments, the immersion cooling system of [A7] includes a first return conduit from the separator to the first fluid reservoir and configured to flow the first working fluid from the separator to the first fluid reservoir, and a second return conduit from the separator to the second fluid reservoir and configured to flow the second working fluid from the separator to the second fluid reservoir to recycle the first working fluid and second working fluid through system, which reduces costs and lessens environmental impact.

[A11] In some embodiments, the immersion cooling system of any of [A1] through [A10] includes a third fluid reservoir containing a third working fluid having a third boiling temperature different from the first boiling temperature and the second boiling temperature, and the mixing device is further configured to mix at least a portion of the third working fluid into the mixed working fluid to allow a larger range of or more precise control of the mixed working fluid boiling temperature.

[B1] In some embodiments, an immersion cooling system includes an immersion tank, a first fluid reservoir, a second fluid reservoir, a mixing device, and a control service. The first fluid reservoir contains a first working fluid having a first boiling temperature. The second fluid reservoir contains a second working fluid having a second boiling temperature. The mixing device mixes at least a portion of the first working fluid and at least a portion of the second working fluid into a mixed working fluid, and the mixing device directs the mixed working fluid to the immersion tank. The control service is in data communication with the mixing device, wherein the control service is configured receive at least one operating property of the immersion tank or an electronic component therein and further configured to adjust a mixing ratio of the first working fluid and the second working fluid based at least partially on the operating property. In some embodiments, the control service allows the immersion cooling system to reactively or proactively adapt to compute loads or environmental properties to reduce environmental impacts and/or reduce energy consumption.

[B2] In some embodiments, the operating property of [B1] is a tank temperature of an interior volume of the immersion tank measured by a sensor. In some embodiments, the control service can adjust the mixing ratio to increase cooling efficiency based on the tank temperature.

[B3] In some embodiments, the operating property of [B1] is a tank pressure of an interior volume of the immersion tank measured by a sensor. As the volume of a vapor phase is greater than the liquid phase, tank pressure can inform the control service of the relative proportion of liquid phase to vapor phase of the mixed working fluid in the immersion tank.

[B4] In some embodiments, the operating property of [B1] is a power draw of at least one electronic component in the immersion tank. In some embodiments, the power draw is related to heat-generation of the electronic component. In at least one embodiment, the power draw indicates that the electronic component will be increasing in temperature before the electronic component reaches a higher operating temperature, allowing proactive adjustments by the control service.

[B5] In some embodiments, the operating property of [B1] is a liquid level in the immersion tank. As the mixed working fluid boils, the liquid level may decrease and, in some embodiments, decrease below one or more electronic components.

[B6] In some embodiments, the operating property of [B1] is received from a VM allocator. The VM allocator may provide to the control service information regarding computational loads and assignments that have associate heat-generation or power draws, allowing the control service to proactively adjust the mixing ratio.

[C1] In some embodiments, a method of thermal management includes mixing a first working fluid having a first boiling temperature with a second working fluid having a second boiling temperature into a mixed working fluid, flowing the mixed working fluid to an immersion tank, and vaporizing the mixed working fluid at an effective boiling temperature different than the first boiling temperature and the second boiling temperature.

[C2] In some embodiments, the method of [C1] includes separating the mixed working fluid into the first working fluid and the second working fluid allowing the first working fluid and second working fluid to be recycled through system, saving costs and lessening environmental impact.

[C3] In some embodiments, the method of [C2] includes, after separating the mixed working fluid, returning the first working fluid to a first fluid reservoir and returning the second working fluid to a second fluid reservoir, allowing the system to recycle the first working fluid and second working fluid.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An immersion cooling system comprising:

an immersion tank;

a first fluid reservoir containing a first working fluid having a first boiling temperature;

a second fluid reservoir containing a second working fluid having a second boiling temperature different than the first boiling temperature;

a mixing device configured to mix at least a portion of the first working fluid and at least a portion of the second working fluid into a mixed working fluid having a third boiling temperature different than the first boiling temperature and the second boiling temperature, and to direct the mixed working fluid to the immersion tank; and a controller programmed to control the mixing device to adjust, in the mixing device, a mixing ratio of the mixed working fluid, to adjust the third boiling temperature based on a desired amount of thermal management by the mixed working fluid, wherein the mixing ratio is a ratio of:

the at least a portion of the first working fluid; and the at least a portion of the second working fluid.

2. The system of claim 1, wherein the first boiling temperature is between 30° C. and 60° C.

3. The system of claim 1, wherein the first boiling temperature is between 60° C. and 90° C.

4. The system of claim 1, wherein the first boiling temperature is at least at least 20° C. less than the second boiling temperature.

5. The system of claim 1, wherein the mixing device is a regulator.

6. The system of claim 1, wherein the mixing device is a junction between a first supply conduit configured to supply the first working fluid toward the immersion tank and a second supply conduit configured to supply the second working fluid toward the immersion tank, wherein the junction connects the first supply conduit and the second supply conduit to a mixed supply conduit that provides fluid communication to the immersion tank.

7. The system of claim 1, further comprising a condenser configured to condense a vapor phase of the mixed working fluid.

8. The system of claim 1, further comprising a separator in fluid communication with the immersion tank and configured to separate mixed working fluid into the first working fluid from the second working fluid, wherein the separator includes a heating element to selectively boil one of the first working fluid and the second working fluid from the mixed working fluid.

9. The system of claim 1, wherein a mixing ratio of the mixing device is based at least partially upon a power draw of at least one electronic component in the immersion tank.

10. The system of claim 1, further comprising:

a third fluid reservoir containing the third working fluid having a third boiling temperature different from the first boiling temperature and the second boiling temperature.

11. The system of claim 1 further comprising:

a control service in data communication with the mixing device, wherein the control service is configured receive at least one operating property of the immersion tank or an electronic component therein and further configured to adjust a mixing ratio of the first working fluid and the second working fluid based at least partially on the operating property.

12. The system of claim 11, wherein the operating property is a tank temperature of an interior volume of the immersion tank measured by a sensor.

13. The system of claim 11, wherein the operating property is a tank pressure of an interior volume of the immersion tank measured by a sensor.

14. The system of claim 11, wherein the operating property is a power draw of at least one electronic component in the immersion tank.

15. The system of claim 11, wherein the operating property is a liquid level in the immersion tank.

16. The system of claim 11, wherein the operating property is received from a Virtual Machine (VM) allocator.

17. An immersion cooling system comprising:

an immersion tank;

a first fluid reservoir containing a first working fluid having a first boiling temperature;

a second fluid reservoir containing a second working fluid having a second boiling temperature;

a mixing device configured to mix at least a portion of the first working fluid and at least a portion of the second working fluid into a mixed working fluid and direct the mixed working fluid to the immersion tank;

a stirring device positioned in the immersion tank and configured to stir the mixed working fluid in the immersion tank to maintain a homogenous distribution of the first working fluid and the second working fluid within the mixed working fluid;

a separator in fluid communication with the immersion tank and configured to separate mixed working fluid into the first working fluid from the second working fluid;

a first return conduit from the separator to the first fluid reservoir and configured to flow the first working fluid from the separator to the first fluid reservoir, and a second return conduit from the separator to the second fluid reservoir and configured to flow the second working fluid from the separator to the second fluid reservoir.

18. An immersion cooling system comprising:

an immersion tank;

a first fluid reservoir containing a first working fluid having a first boiling temperature;

a second fluid reservoir containing a second working fluid having a second boiling temperature;

a third fluid reservoir containing the third working fluid having a third boiling temperature different from the first boiling temperature and the second boiling temperature; and a mixing device configured to mix at least a portion of the first working fluid, at least a portion of the second working fluid, and at least a portion of a third working fluid into a mixed working fluid and direct the mixed working fluid to the immersion tank.

* * * * *